(12) United States Patent
Wang

(10) Patent No.: US 7,137,046 B2
(45) Date of Patent: Nov. 14, 2006

(54) HIGH SPEED COMPARATOR FOR 10G SERDES

(75) Inventor: Peiqing Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 373 days.

(21) Appl. No.: 10/638,370

(22) Filed: Aug. 12, 2003

(65) Prior Publication Data

US 2005/0039088 A1 Feb. 17, 2005

(51) Int. Cl.
*G06F 11/00* (2006.01)

(52) U.S. Cl. .................. 714/704; 714/707; 714/775

(58) Field of Classification Search ............... 714/704, 714/765, 775, 724, 707, 735, 736; 711/154
See application file for complete search history.

(56) References Cited

U.S. PATENT DOCUMENTS

| 4,523,314 | A | * | 6/1985 | Burns et al. ................. 714/65 |
| 5,206,889 | A | * | 4/1993 | Unkrich ....................... 377/20 |
| 5,525,935 | A | * | 6/1996 | Joo et al. ..................... 331/11 |
| 5,715,259 | A | * | 2/1998 | Lee et al. ................... 714/775 |
| 5,778,440 | A | * | 7/1998 | Yiu et al. ................... 711/154 |
| 5,977,864 | A | * | 11/1999 | Buonpane et al. ....... 340/146.2 |
| 6,081,570 | A | * | 6/2000 | Ghuman et al. ........... 375/368 |
| 6,424,189 | B1 | * | 7/2002 | Su et al. ..................... 327/141 |
| 2004/0153913 | A1 | * | 8/2004 | Fishman et al. ........... 714/724 |

\* cited by examiner

*Primary Examiner*—Albert Decady
*Assistant Examiner*—Fritz Alphonse
(74) *Attorney, Agent, or Firm*—Sterne, Kessler, Goldstein & Fox, P.L.L.C.

(57) ABSTRACT

An error counter including receive logic to compare transmitted bits with received bits and output a vector with a logic 1 for every bit that does not match and a logic 0 for every bit that matches. A plurality of stages are sequentially arranged. Each stage includes a plurality of carry save adders inputting three inputs and outputting a sum bit and a carry bit, the carry save adders of a first stage each receiving corresponding three bits of the vector as input, the carry save adders of stages subsequent to the first stage each receiving corresponding three bits representing sum bits and carry bits from the previous stage and each carry save adder outputting a carry bit and a sum bit to a next stage for use as inputs to the carry save adders of the next stage. A synchronizer converts an output of the stages into an N-bit sum.

14 Claims, 10 Drawing Sheets

HIGH SPEED COMPARATOR FOR 10G SERDES

BACKGROUND OF THE INVENTION

1. Field of the Invention

The present invention relates to bit error testing, and more particularly, to an integrated high speed packet bit error test circuit.

2. Related Art

Communicating information via the Internet and other digital communications systems has become common in the United States and elsewhere. As the number of people using these communications systems has increased so has the need for transmitting digital data at ever increasing rates.

As will be understood by persons skilled in the relevant arts, digital communications systems are designed, for example, using look-ahead, pipelining, and parallelism techniques. These known techniques have enabled engineers to build digital communications systems, using available manufacturing technologies, which operate at data rates in excess of 1 Gb/s.

There is a current need for new design techniques and digital logic circuits that can be used to build high-speed digital communication systems. In particular, design techniques and digital logic circuits are needed which can be used to build digital communications circuits that operate at 10 Gb/s and higher.

Testing of the integrity of the communications channel is an important part of any communications system. As transmission speeds increase, the potential for errors generated to channel imperfections, noise, and other factors becomes greater. Currently commercially available systems transmit data at multiple Gigabits per second. For example, the 10 G SERDES (10 Gigabit serializer-deserializer) transmits data on four 2.5 Gigabit channels, for a total of 10 Gigabits/second. Normally, in order to test the error rate of the system, a stand-alone piece of equipment needs to be hooked up to the transmission channel. Test packets are generated by the stand-alone piece of equipment and transmitted through the channel, and are then received back by the stand-alone piece of equipment. The received data is compared to the transmitted data, and the error rate is calculated.

A disadvantage of this approach is the need for a separate piece of equipment that a technician needs to carry around, and the need to "plug it in" into the transmission system in order to test the packet bit error rate. Accordingly, it is desirable to have a packet bit error test capability built into the transmission chip, such as a 10 G SERDES (or higher) chip, that would enable on-the-fly testing of the packet bit error rate of the communications channel.

Furthermore, one of the problems of testing error rate on-the-fly is the high data rate and high clock speeds of a 10 G SERDES communications channel. A 6.4 nanosecond clock, commonly used in the test equipment, translates to 156 megacycles per second. Within the 6.4 nanoseconds available for testing, 80 bits of received data need to be compared to 80 bits of previously transmitted data. Additionally, a 20% margin is required to account for a process variation, therefore, the window for performing the error rate calculation is only 80% of 6.4 nanoseconds. This presents challenges to the designer of a circuit that compares received data with transmitted data, and calculates the bit error rate.

SUMMARY OF THE INVENTION

The present invention is directed to a high speed comparator for 10 G SERDES that substantially obviates one or more of the problems and disadvantages of the related art.

Accordingly, there is provided an error counter including logic to compare transmitted bits with received bits and output a vector with a logic 1 for every bit that does not match and a logic 0 for every bit that matches. A plurality of stages are sequentially arranged. Each stage includes a plurality of carry save adders inputting three inputs and outputting a sum bit and a carry bit, the carry save adders of a first stage each receiving corresponding three bits of the vector as input, the carry save adders of stages subsequent to the first stage each receiving corresponding three bits representing sum bits and carry bits from the previous stage and each carry save adder outputting a carry bit and a sum bit to a next stage for use as inputs to the carry save adders of the next stage. A synchronizer converts an output of the stages into an N-bit sum.

Additional features and advantages of the invention will be set forth in the description that follows. The advantages of the invention will be realized and attained by the structure particularly pointed out in the written description.

It is to be understood that both the foregoing general description and the following detailed description are exemplary and explanatory and are intended to provide further explanation of the invention.

DETAILED DESCRIPTION OF THE INVENTION

Reference will now be made in detail to the embodiments of the present invention, examples of which are illustrated in the accompanying drawings.

This invention relates to a Packet Bit Error Rate Tester (PBERT) design, which is integrated into a 10 G SERDES chip. It provides a novel architecture and custom design to achieve the high-speed requirement with minimum logic gates. The PBERT generates and processes packet data that can be transmitted over any serial port to perform bit error testing, and captures the receiving packets for further diagnosis. This invention is directed to checking received data from 4 lanes of the 10 G SERDES, which supplies 80 bits of data every clock cycle, and computes the error bits in the data stream on-the-fly.

This invention takes an 80-bit input vector, which is the Exclusive-OR gate output of the received data and the transmitted data from the PBERT Receive (Rx) memory. Any logic 1 of the 80-bit vector represents one error bit. In order to compute the total number of bit error of these 80 bits, the 80 bits are summed.

In this invention, a binary-tree structure is used to implement the 80-bit wide summation. 10 stages of Carry-Save- Adders (CSAs) (illustrated in FIGS. 1B–10) are used to get the final 7-bit sum result, which is the best trade-off for meeting the speed requirement with the minimum required logic gates. (The term CSA is used here is to make it clear that the carry-bit is saved and carried over from the one stage to its next stage to break down its carry critical path for the 80 bit summation. The worst case carry critical path is 80 stages of carry ripple logic gates, and the 6.4 ns speed cannot be easily achieved if the critical path is not reduced). Since the carry bit from each stage always expands 1-bit of the partial sum results, and the final result could be represented by a 7-bit unsigned binary number (the maximum bit error count for each 80-bit data is 80, the minimum binary representation of 80 requires 7-bit). Each CSA is equivalent to a 1-bit full-adder that has minimum logic of sum and carry. The present invention uses a total 79 such CSAs (for 80 bit summing) of this binary-tree bit-error searching and summing architecture.

Figure 1A:
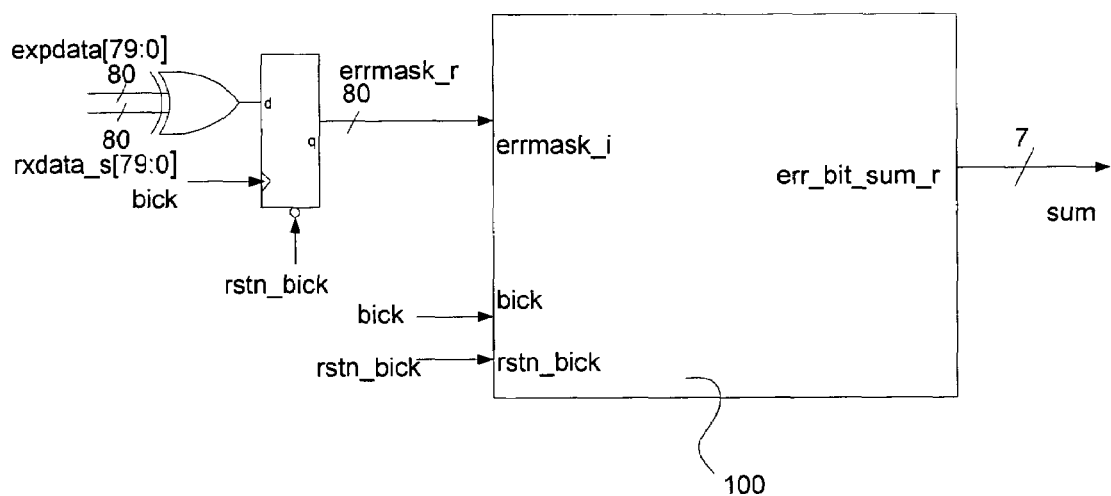
FIG. 1A shows the top-level block diagram of a comparator.

FIG. 1A shows the block diagram of the comparator which includes the error counter 100 of the present invention. As shown in FIG. 1A, the error counter 100 receives an 80 bit vector errmask_r, a clock (bick) and a synchronous reset (rstn_bick) signals. The errmask_r is the the register data of the 80 bit XOR'ed results of the received data (rxdata_s[79:0]) and the expected transmitted data (expdata [79:0]). The error counter 100 generate a 7 bit sum signal that counts the total bit errors of the input vector errmask_r.

A binary-tree structure is used for summing the error bits from 80 bit wide data. It uses 10 stages of adders (see FIGS. 1B–10) to compute the final 7-bit sum of total error bits from the 80 bit wide data, Errmask_r[79:0]. Received data is compared to the transmitted data that is stored in memory. In other words, received data is XOR'ed with transmitted data during bit-error-rate test to generate an 80 bit vector, rmask_r which is used by the error counter 100 to count the bit errors. If any of the 80 bits is 1, this represents a mismatch (i.e., an error). Since Errmask_r is the register output of the XOR'ed data, a critical path in this design is the signal that propagates through all 10 stages. The number of stages in this binary tree structure can always be reduced, but it will require using more CSAs in some of the stages. 10 stages is therefore believed to be the optimal trade-off between speed and gate count.

It is important to label the partial result of the CSA at each stage properly to help make a clean and correct logic design at each stage. Since the carry bit from each stage always expands 1-bit of the partial sum results, the final results can be represented by a 7-bit unsigned binary number (the maximum bit error count for each 80-bit data is 80, the minimum binary representation of 80 requires 7-bits).

The following labeling convention is used for the results at each stage. The label is specified as isum-x-y-i[1:0], where x could be 1, 2, 4, 8, 16, 32, 64, which indicates that this bit needs to be aligned with the $k^{th}$ bit of the final sum Err_bit_sum_r[7:0] (i.e. $x=2^k$); y=a, b, ... j represents each stage in this binary-tree summation, where "a" is the first stage and "j" is the tenth stage; i corresponds to each CSA at every stage; isum-x-y-i[1] is the carry bit and isum-x-y-i[0] is the sum bit.

Figure 1B:
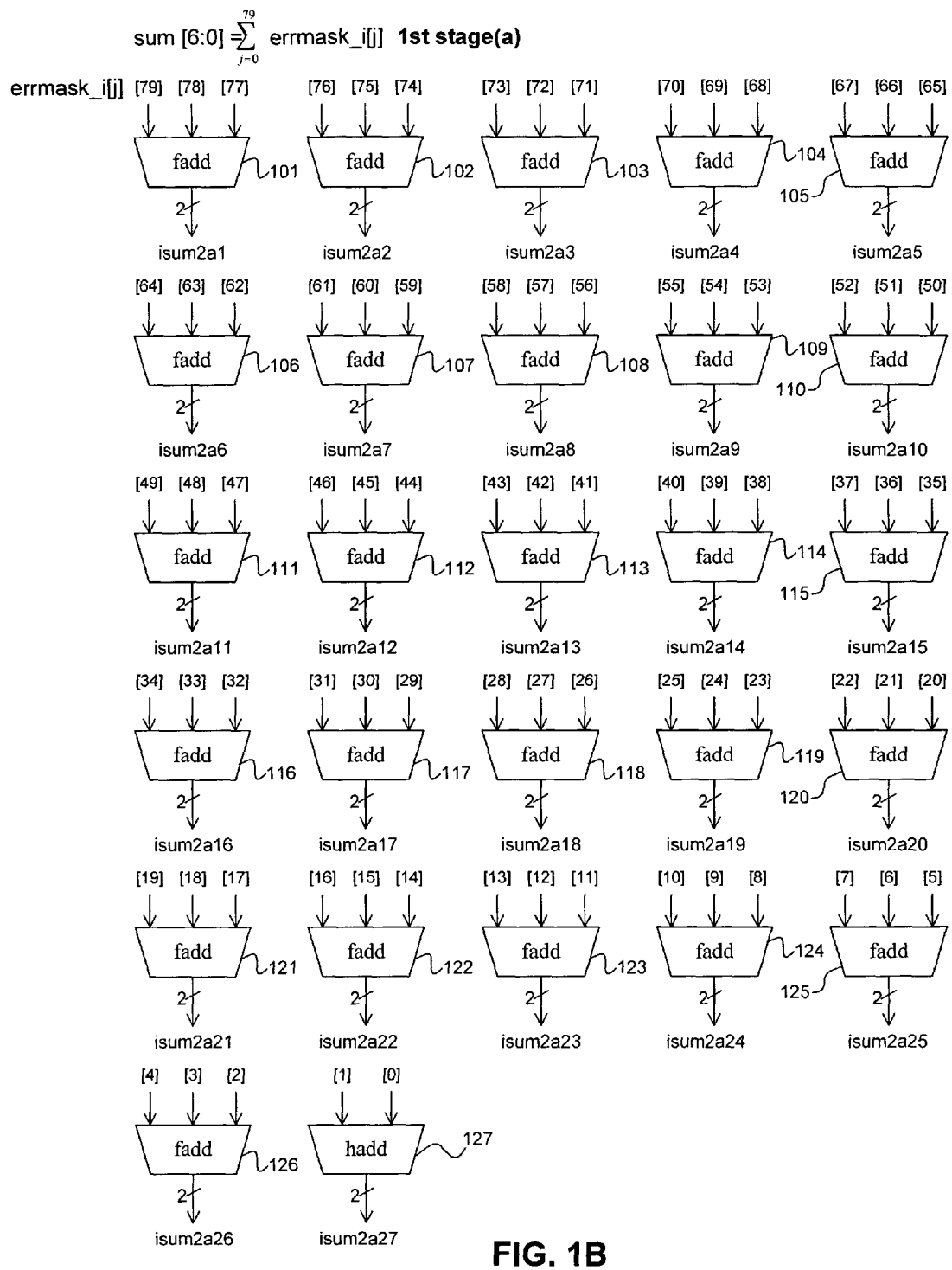
FIG. 1B shows a first stage of an error counter of the present invention.

As shown in FIG. 1B, in the first stage (stage a) all the error-bits are searched by summing the 80 bits together using 26 full adders 101–126 and one half-adder 127. Each of the 26 full adders 101–126 take three inputs from Errmask_r[79:2], and the half adder 127 takes input from Errmask_r[1:0] (which gives 26×3+2×1=80 bits). Each full adder 101–126 and the half adder 127 generates its carry bit and sum bit, which are labeled as isum-2-a-1[1:0], isum-2-a-2[1:0], ... isum-2-a-27[1:0]. Here, isum-2-a-i[1] is the carry bit, and isum-2-a-i[0] is the sum bit (i=1, 2, ... 27).

Figure 2:
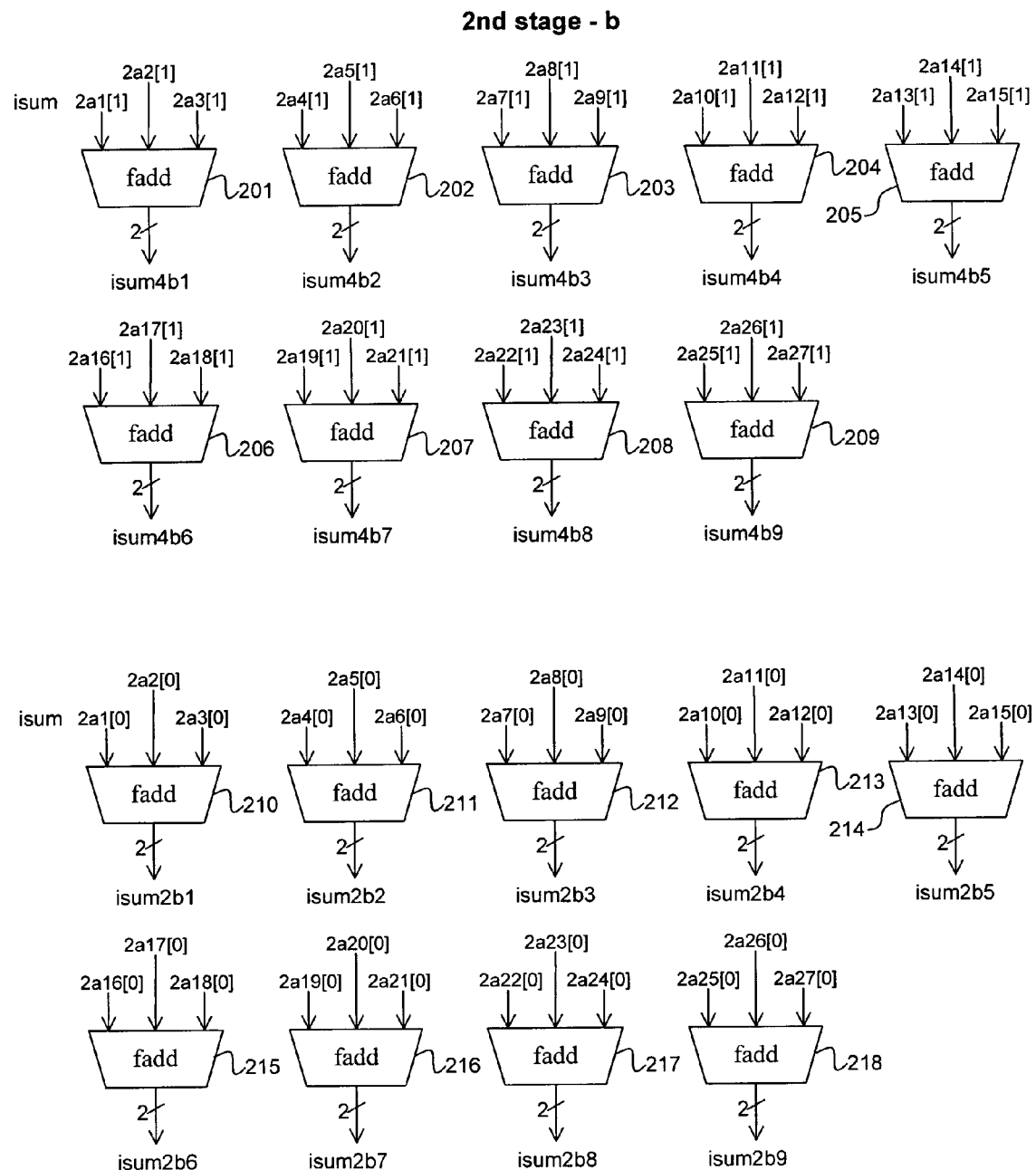
FIGS. 2–10 shows stages 2–10 of the error counter.

As shown in FIG. 2, the second stage (stage b) takes as input 27 2-bit data buses from the first stage (stage a), which are the partial results of the summing of all 80 bits from Errmask_r[79:0] input, are used as input to the second stage (stage b). To take the best advantage of the parallelism of this binary-tree structure, 27/3=9 full adders are used for both isum-2-a-i[1] and isum-2-a-i[0] (i=1, 2, ... 27). Thus, a total of 18 full adders 201–218 are used in the second stage to improve the speed of operation. In order to align the carry-bit and sum-bit properly, the summing of each carry bit from the first stage (stage a) generates the partial results isum-4-b-1[1:0], isum-4-b-2[1:0], ... isum-4-b-9[1:0]; and the summing of each sum bit from first stage (stage a) generates the partial results isum-2-b-1[1:0], isum-2-b-2[1:0], ... isum-2-b-b-[1:0].

Figure 3:
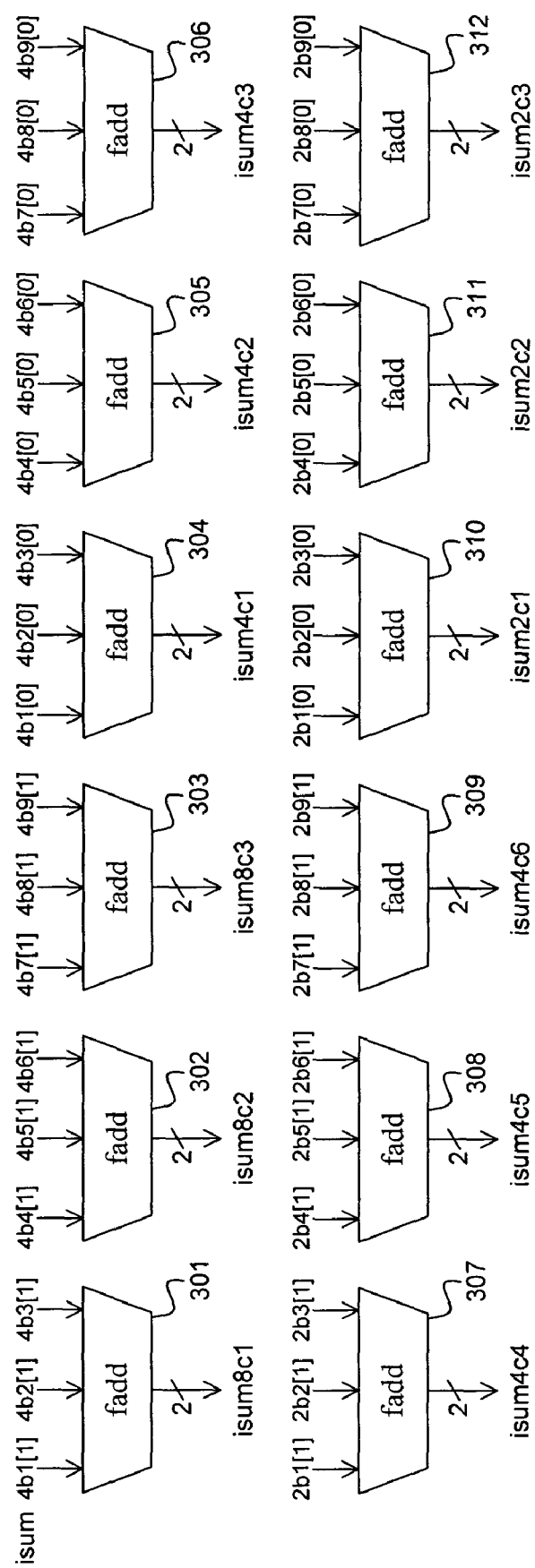

As shown in FIG. 3, the third stage (stage c) uses 12 full adders 301–312 to sum all the carry bits and the sum bits from the second stage. The summing of isum-4-b-i[1] (i=1, 2, ... 9) generates isum-8-c-1[1:0], isum-8-c-2[1:0], and isum-8-c-3[1:0]; The summing of isum-4-b-i[0] (i=1, 2, ... 9) and isum-2-b-i[1] (i=1, 2, ... 9) generates isum-4-c-1[1:0], ... isum-4-c-6[1:0]. The summing of isum-2-b-i[1] (i=1, 2, ... 9) generates isum-2-c-1[1:0], isum-2-c-2[1:0] and isum-2-c-3[1:0]. The summing of isum-2-c-1[0], isum-2-c-2[0] and isum-2-c-3[0] generates the partial result isum-2-d-1[1:0].

Figure 4:
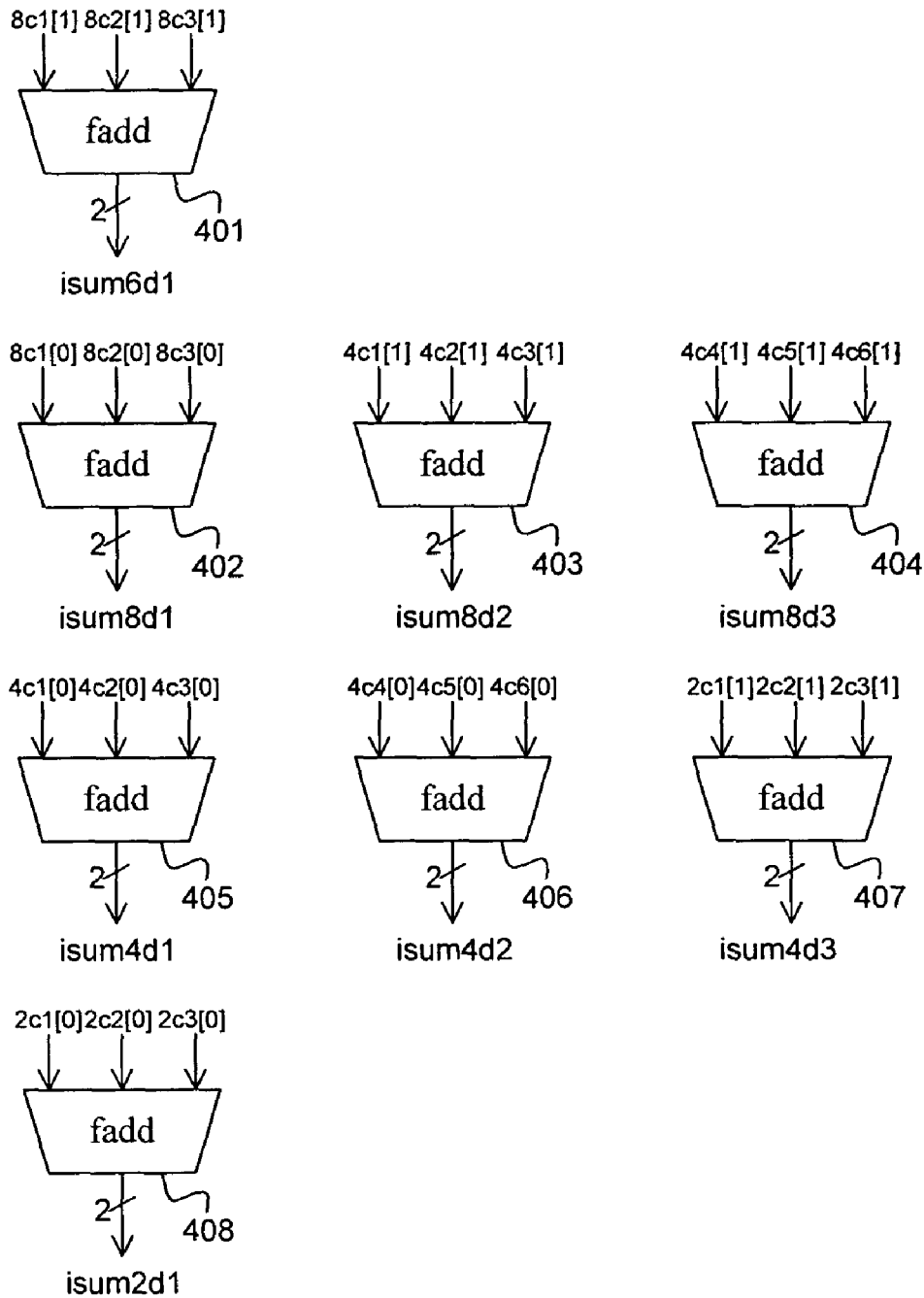

As shown in FIG. 4, the fourth stage (stage d) only needs to use 8 full adders 401–408. The summing of isum-8-c-1[1], isum-8-c-2[1] and isum-8-c-3[1] generates isum-16-d-1[1:0]. The summing of isum-8-c-1[0], isum-8-c-2[0], isum-8-c-3[0] and isum-4-c-i[1] (i=1, ..., 6) generates isum-8-d-1[1:0], isum-8-d-2[1:0], isum-8-d-3[1:0]. The summing of isum-4-c-i[0] (i=1, ..., 6), isum-2-c-i[1] (i=1, 2, 3) generates isum-4-d-i[1:0] (i=1, 2, 3).

From the first stage (stage a) and the fourth stage (stage d), as may be seen from the description above and FIGS. 1B–4, the maximum number of full adders are used to achieve a full-parallelism of the binary tree summation to achieve the fast convergence of the summation. Thus, at the output of the fourth stage, there are only eight 2-bit partial summing results for further convergence. From the fifth stage and higher, some logic gates can be saved by either retiring (forwarding) some bits to the final sum result or forwarding them to the next stage in order to achieve minimum logic gate counts.

Figure 5:
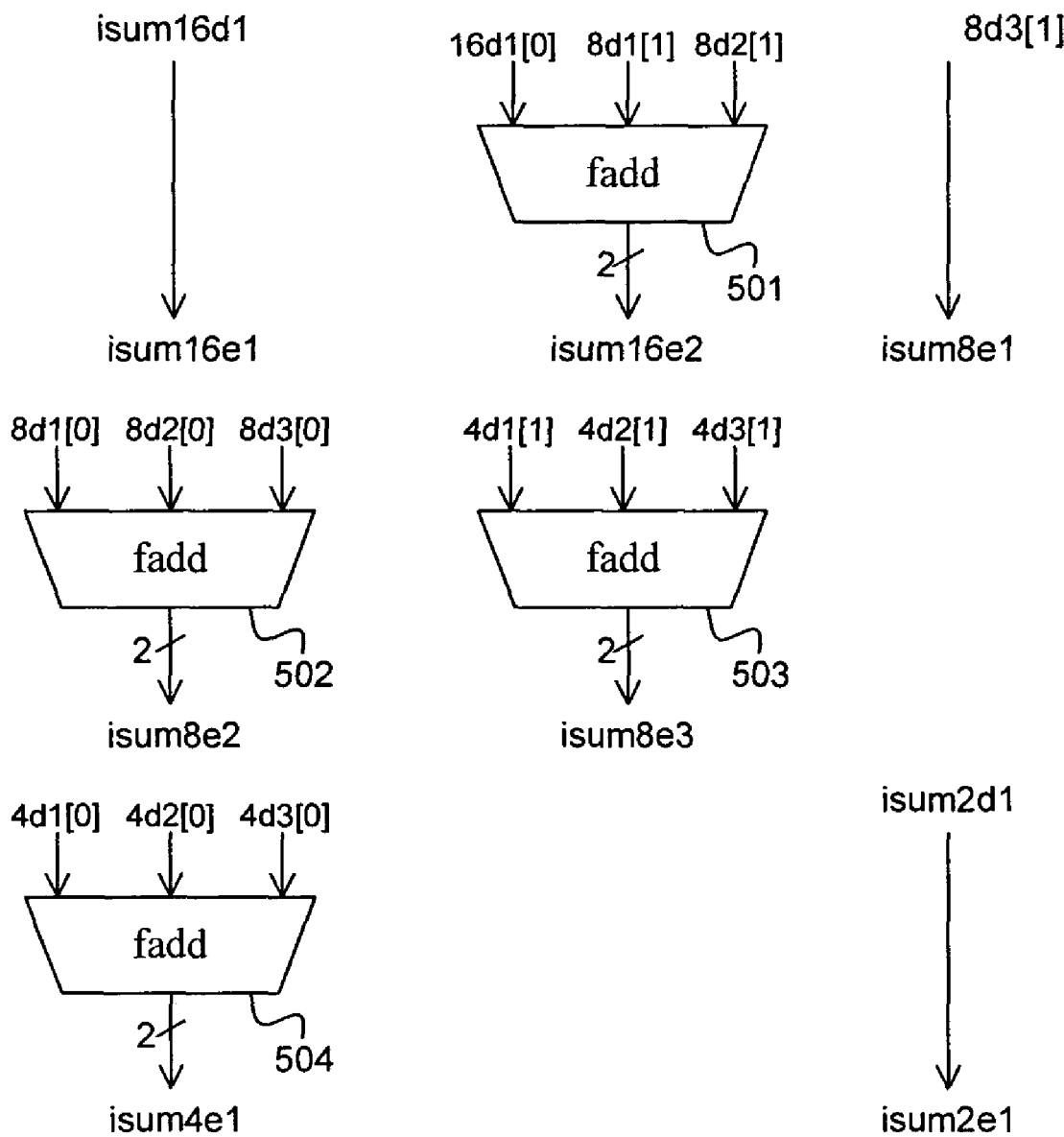

As shown in FIG. 5, the fifth stage (stage e) uses only 4 full adders 501–504 to sum the results from fourth stage, isum-16-d-1[1] can be forwarded to the sixth stage (stage f), and will become isum-16-e-1. The summing of isum-16-d-1[0], isum-8-d-1[1], and isum-8-d-2[1] generates isum-16-e-1[1:0], isum-8-d-3[1] can be forward to the sixth stage, and becomes isum-8-e-1. The summing of isum-8-d-1[0], isum-8-d-2[0], isum-8-d-3[0] generates isum-8-e-2[1:0]. The summing of isum-4-d-1[1], isum-4-d-2[1], isum-4-d-3[1] generates isum-8-e-3[1:0]. The summing of isum-4-d-1[0], isum-4-d-2[0], isum-4-d-3[0] generates isum-4-e-1[1:0], isum-2-d-1[1:0] can be forward to the sixth stage. As it happens, isum-2-d-1[0] can be retired as the final sum result err_bit_sum_r[0], and isum-2-d-1[1] becomes isum-2-e-1.

Figure 6:
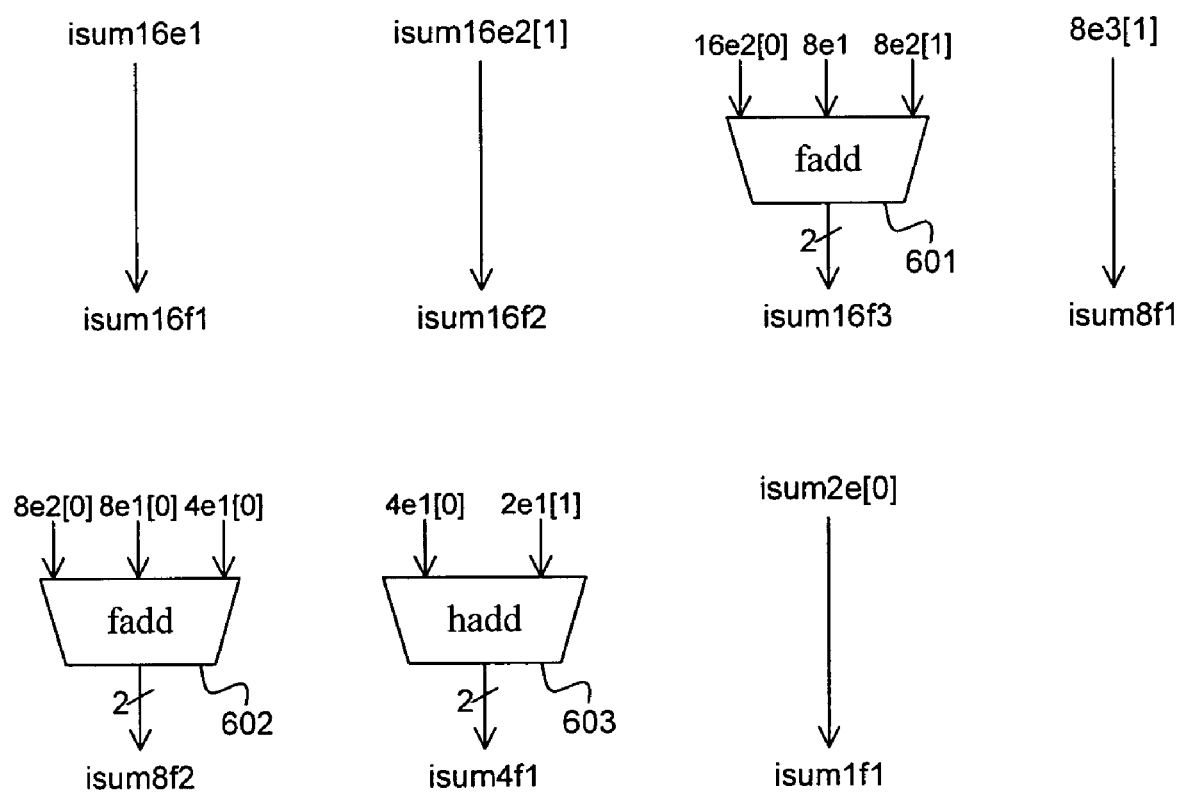

As shown in FIG. 6, the sixth stage (stage f) uses only 2 full adders 601–602 and one half adder 603 to further converge the results from fifth stage. isum-16-e-1 can be forwarded to the seventh stage, and becomes isum-16-f-1. isum-16-e-2[1] can be forwarded to the seventh stage, and becomes isum-16-f-2. The summing of isum-16-e-2[0], isum-8-*e*-1[1], isum-8-*e*-2[0] generates isum-16-*f*-3[1:0]. isum-8-*e*-3[1] can be forwarded to the seventh stage (stage g), and becomes isum-8-*f*-1. The summing of isum-8-*e*-2[0], isum-8-*e*-1[0], isum-4-*e*-1[1] generates isum-8-*f*-2[1:0]. The summing of isum-4-*e*-1[0] and isum-2-*e*-1[1] generates isum-4-*f*-1[1:0]. Actually, isum-4-*f*-1[0] can be retired as the final sum result err_bit_sum_r[1].

Figure 7:
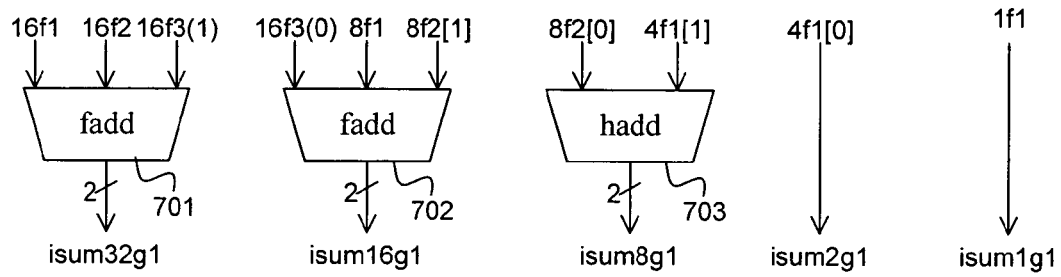

As shown in FIG. 7, the seventh stage (stage g) uses only 2 full adders 701–702 and one half adder 703 to further converge the results from sixth stage (stage f). The summing of isum-16-*f*-1, isum-16-*f*-2, isum-16-*f*-3[1] generates isum-32-*g*-1[1:0]. The summing of isum-16-*f*-3[0], isum-8-*f*-1, isum-8-*f*-2[1] generates isum-16-*g*-1[1:0]. The summing of isum-8-*f*-2[0] and isum-4-*f*-1[1] generates isum-8-*g*-1[1:0]. isum-8-*g*-1[0] can be retired as the final sum result err_bit_sum_r[2].

Figure 8:
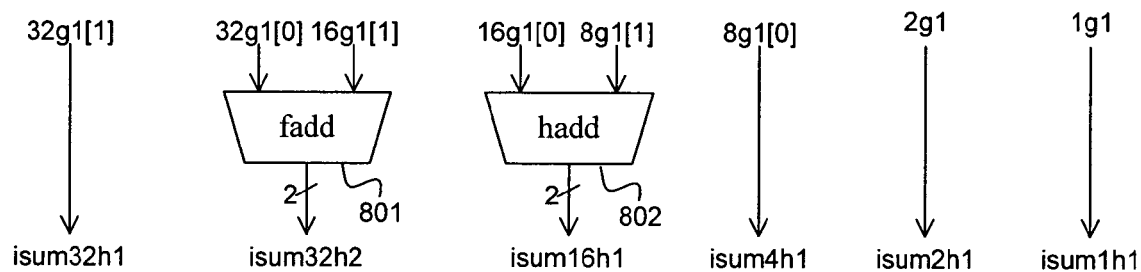

As shown in FIG. 8, the eigthth stage (stage h) uses only 2 half adders 801–802 for further convergence. isum-32-*g*-1[1] can be forward to the ninth stage (stage i), and becomes isum-32-*h*-1. The summing of isum-32-*g*-1[0] and isum-16-*g*-1[1] generates isum-32-*h*-2[0]. The summing of isum-16-*g*-1[0] and isum-8-*g*-1[1] generates isum-16-*h*-1[1:0]. isum-16-*h*-1[0] can be retired as the final sum result err_bit_sum_r[3].

Figure 9:
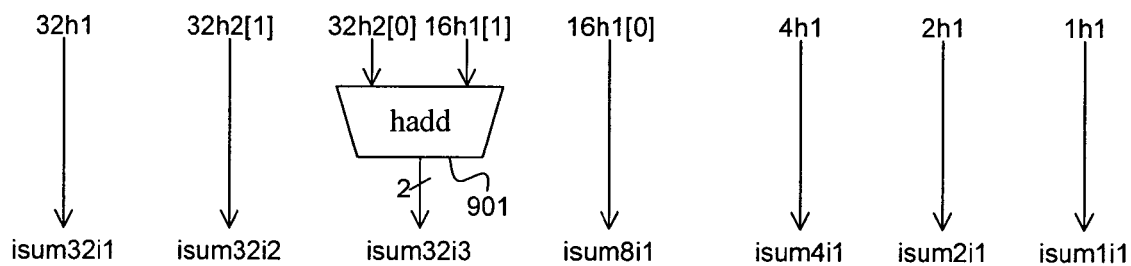

As shown in FIG. 9, the ninth stage (stage i) only uses one half adder 901. isum-32-*h*-1 can be forward to tenth stage (stage j), and becomes isum-32-*i*-1. isum-32-*h*-2[1] can be forward to tenth stage, and becomes isum-32-*i*-2. The summing of isum-32-*h*-2[0] and isum-16-*h*-1[1] generates isum-32-*i*-3[1:0]. isum-32-*i*-3[0] can be retired as the final sum result err_bit_sum_r[4].

Figure 10:
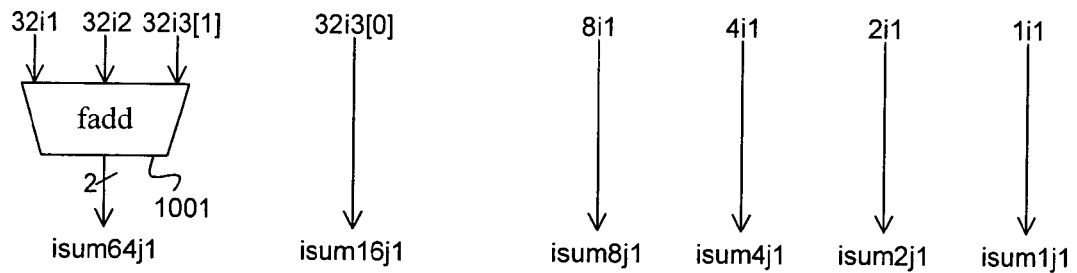

As shown in FIG. 10, the tenth stage (stage j) uses one full adder 1001 to sum isum-32-*i*-1, isum-32-*i*-2, isum-32-*i*-3[1], which becomes isum-64-*j*-1[1:0], which are the same two most significant bits of err_bit_sum_r[6:5].

Figure 11:
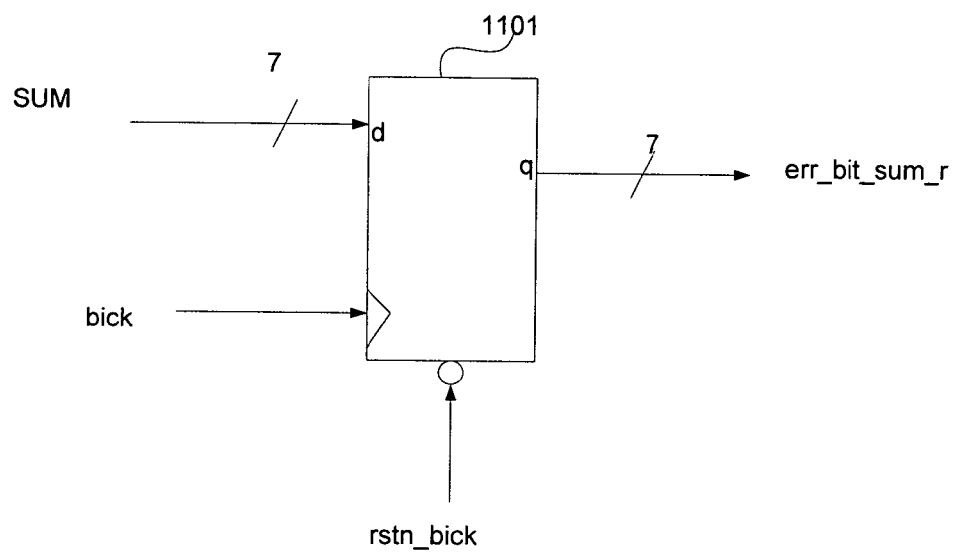
FIG. 11 shows a synchronizer that converts an output of the last stage of the error counter into a clock-synchronized 7-bit sum.

As shown in FIG. 11, a synchronizer 1101 is used to convert the 7 bit output of the block 100 of FIG. 1A to a clock-synchronized 7 bit sum (error bit sum), using the binary clock and reset binary clock signals as shown in FIG. 11.

Figure 12:
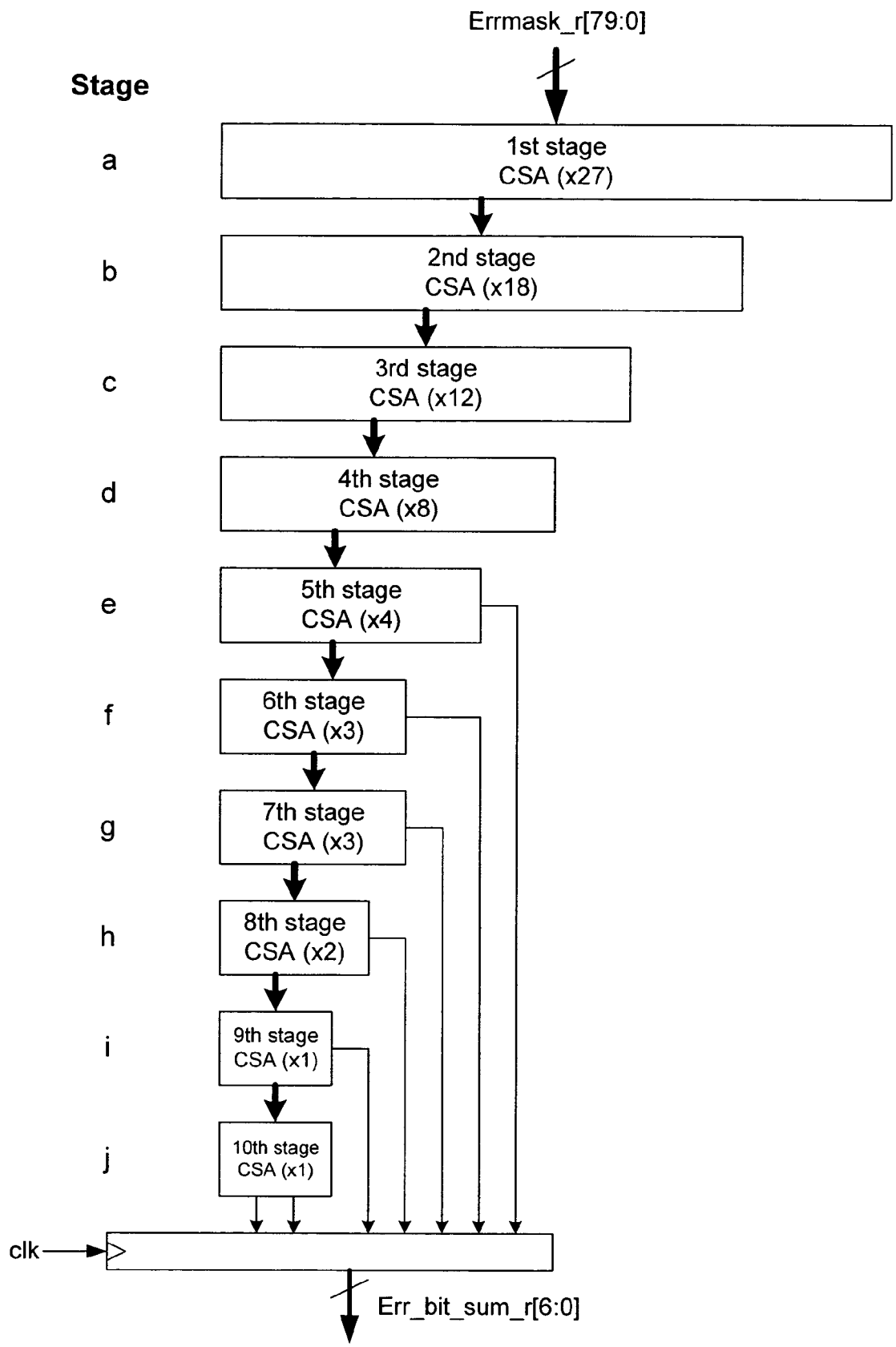
FIG. 12 conceptually summarizes the process shown in FIGS. 1A–11.

FIG. 12 conceptually illustrates the process described above with reference to FIGS. 1A–11. As shown in FIG. 12, the input to the process is the XOR'ed output from a register, which represents the XORing of the transmitted data and the received data (Errmask_r[79:0]). The first stage (stage a) uses 27 carry save adders 101–127. The second stage (stage b) uses 18 carry save adders 201–218, and so forth. The binary search parallelism allows a progressive reduction in the number of logic circuits used for computing the sum.

In the design described above, a 3-to-2 compression is used. In other words, three bits are inputted into each carry save adder, and two bits (the sum bit and the carry bit) are outputted. As the number of bits that need to be compared increases, the complexity of the system grows as the logarithm, rather than linearly. In other words, to go to a 20 G SERDES (4 channels of 5 gigabits per second each), the number of Carry Save Adders in the system in the circuit generally increases as log 2, rather than ×2.

Additionally, in the discussion above, a 3-to-2 Carry Save Adder was used. However, other variations are possible. For example, a 4-to-2 adder, rather than a 3-to-2 adder, can be used. The choice of the adder depends on the overall system considerations, the clock speed, the number of bits to be added, the design of the Carry Save Adder and the attendant propagation delays, etc.

Thus, a custom design approach is taken above to make the best trade-offs between speed and logic gate count.

Conclusion

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An error counter comprising:
a comparator to compare transmitted bits with received bits and output a vector with a logic 1 for every bit that does not match and a logic 0 for every bit that matches;
a plurality of sequentially arranged stages, each stage including a plurality of carry save adders inputting three inputs and outputting a sum bit and a carry bit, the carry save adders of a first stage each receiving corresponding three bits of the vector as input, the carry save adders of stages subsequent to the first stage receiving corresponding sum bits and carry bits from the previous stage and each outputting a carry bit and a sum bit to a next stage for use as inputs to the carry save adders of the next stage; and
a synchronizer that converts an output of the stages into a clock-synchronized N-bit sum.

2. The error counter of claim 1, wherein the vector includes 80 bits, and wherein the error counter includes 10 stages.

3. The error counter of claim 1, wherein at least some of the outputs of some stages other than the last stage are forwarded to the synchronizer directly.

4. The error counter of claim 1, wherein a first stage includes 26 full adders and one half adder.

5. The error counter of claim 4, wherein a second stage includes 9 full adders inputting the carry bits from the first stage, and 9 full adders inputting the sum bits from the first stage.

6. The error counter of claim 5, wherein a third stage includes 6 full adders inputting the carry bits from the second stage, and 6 full adders inputting the sum bits from the second stage.

7. The error counter of claim 6, wherein a fourth stage includes 4 full adders inputting the carry bits from the third stage, and 4 full adders inputting the sum bits from the third stage.

8. The error counter of claim 7, wherein the fifth stage includes 2 full adders inputting the carry bits from the fourth stage, and 2 full adders inputting the sum bits from the fourth stage.

9. The error counter of claim 8, wherein a sixth stage includes 2 full adders and one half adder inputting the carry bits and the sum bits from the fifth stage.

10. The error counter of claim 9, wherein a seventh stage includes 2 full adders and one half adder inputting the carry bits and the sum bits from the sixth stage.

11. The error counter of claim 10, wherein an eighth stage includes 2 full adders and one half adder inputting the carry bits and the sum bits from the seventh stage.

12. The error counter of claim 11, wherein a ninth stage includes 1 full adder and one half adder inputting the carry bits and the sum bits from the eighth stage.

13. The error counter of claim 12, wherein the last stage includes 1 half adder and one half adder inputting the carry bits and the sum bits from the seventh stage.

14. An error counter comprising:
a comparator to compare transmitted bits with received bits and output a vector with a logic 1 for every bit that does not match and a logic 0 for every bit that matches;
a plurality of sequentially arranged stages, each stage including a plurality of carry save adders each inputting four inputs and each outputting a sum bit and a carry bit, the carry save adders of a first stage each receiving corresponding four bits of the vector as input, the carry save adders of stages subsequent to the first stage each receiving corresponding sum bits and carry bits from the previous stage and outputting a carry bit and a sum bit to a next stage for use as inputs to the carry save adders of the next stage; and
a synchronizer that converts an output of the stages into a clock-synchronized N-bit sum.

* * * * *